Feb. 25, 1964 C. R. BARNES ETAL 3,122,450

PROCESS FOR DEPOSITING THIN FILMS
OF SILICON NITRIDE DIELECTRIC
Filed Dec. 27, 1960

INVENTORS
CHARLES R. BARNES
CHARLES R. GEESNER
BY
ATTORNEYS 3,122,450

PROCESS FOR DEPOSITING THIN FILMS OF SILICON NITRIDE DIELECTRIC

Charles R. Barnes, Medway, and Charles R. Geesner, Waynesville, Ohio, assignors to the United States of America as represented by the Secretary of the Air Force Filed Dec. 27, 1960, Ser. No. 78,787
3 Claims. (Cl. 117—230)
(Granted under Title 35, U.S. Code (1952), sec. 266)

Figures 1, 2:
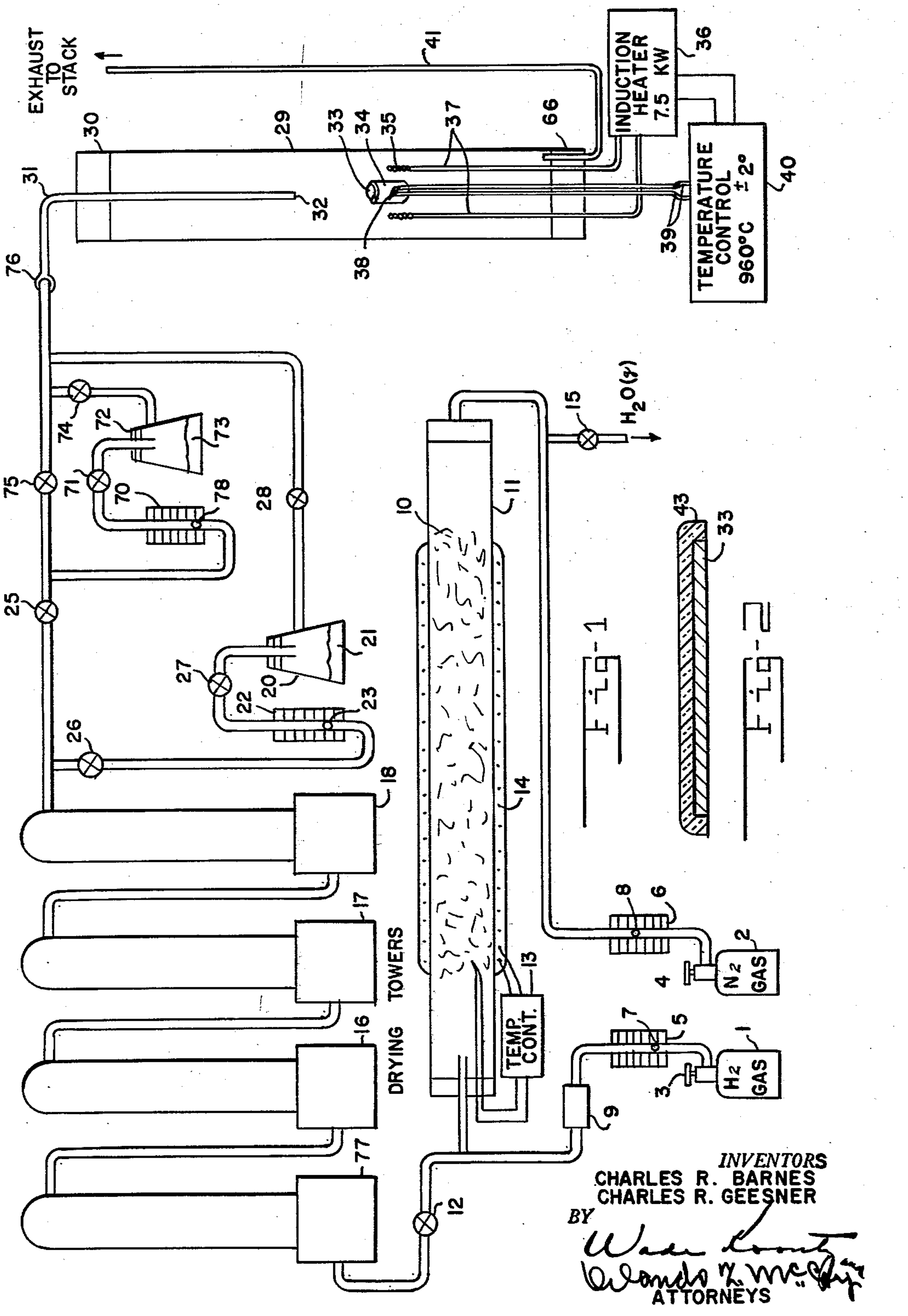

The invention described herein may be manufactured and used by or for the United States Government for governmental purposes without the payment to us of any royalty thereon.

This invention concerns an improved process for depositing thin films of silicon nitride dielectric upon a substrate of molybdenum or the like.

This invention is an improvement of the process disclosed in our copending application Serial No. 837,306, filed August 31, 1959, now U.S. Patent 3,038,243, for a Silicon Nitride Dielectric and as published in the Journal of the Electrochemical Society, volume 107, No. 2, February 1960.

This invention has as its object the provision of a new and improved process for accomplishing the deposition of silicon nitride on a metal substrate as compared with any method that has preceded it in time.

At present there is an increasing requirement in the military field for dielectric materials such as are employed in the manufacture of capacitors and the like for use under environmental temperatures of 500° C. and above. Ceramic and dielectric materials, while capable of withstanding high temperatures unfortunately suffer a great increase in the dissipation factor at temperatures of the order of 500 to 600° C.

It has been discovered that the deposition of a thin film of silicon nitride dielectric on a substrate is catalyzed by the presence of low traces of water vapor in the reacting gases that are contemplated hereby. The required trace of water vapor in the reacting gas mix is adjusted between the dry deposition of silicon nitride contaminated with spots of silicon and the deposition of the silicon nitride containing oxides of silicon on the substrate in the presence of excessive water vapor.

The improved deposition process that is disclosed herein provides a nonporous film of silicon nitride that is strongly bonded to the surface of an underlying metal. The invention is of particular interest and value in the making of electronic components. The silicon nitride can also be employed as an encapsulating material to protect capacitor assemblies and the like, from oxidation up to the stated temperatures.

A representative capacitor that is made in accordance with the present invention comprises a thin metal disc or wafer substrate that has deposited on one side thereof a coating of silicon nitride dielectric and a second capacitor plate deposited over the dielectric in the form of a thin conducting metal film. The capacitor leads are soldered to the metal substrate and to the conductive coating on the dielectric material. In order to prevent oxidation of the capacitor plates the capacitor may be completely inclosed within a silicon nitride encapsulation, as described in our copending application Serial No. 837,306.

The capacitor in accordance with the invention is unique in that its electrical characteristics are satisfactory in high temperature environments as high as 600° C.

The method of making a capacitor in accordance with the present invention comprises placing a clean substrate disc of molybdenum or other suitable metal on a graphite core in a closed deposition chamber with the core surrounded by a heating coil supplied with radio frequency current to heat the core and the substrate disc by induction or eddy current heating. The heating current is controlled thermostatically such that the substrate is maintained at a surface temperature of 960° C. ±2°. While the substrate is at the controlled temperature, a mixture of clean hydrogen and nitrogen gases that are humidified to a controlled degree and silicon bromide vapor is directed onto the surface of the substrate within the deposition chamber. Chemical action causes the silicon bromide to decompose and causes the silicon to unite with the nitrogen as a strongly adherent film of silicon nitride of the formula $Si_3N_4$ which is deposited as a film of controlled thickness on the surface of the substrate.

The water vapor is present in the mixed gases in a preferred amount expressed in terms of dew point of the vapors within the range of from —80° F. to —90° F. The dew point is the temperature at which the condensation of water vapor occurs. The mixture of gases will be fully saturated with water vapor at its dew point temperature.

The metal substrate disc is then removed from the deposition chamber and is transferred, as disclosed in our application Serial No. 837,306, that issued on June 12, 1962, as the Patent No. 3,038,243, to other apparatus including a deposition chamber in which a metal film such as molybdenum is deposited on the substrate to form the second plate of the capacitor. Gold as the second plate of the capacitor may be plated by the well known vacuum evaporation process in which gold is evaporated in an evacuated chamber and plated from the vapor phase on the silicon nitride coating on the substrate. In other cases plating may be accomplished by chemical decomposition of metal from metallic chlorides or carbonyl chlorides in a manner that is more completely described in our application Serial No. 837,306.

The capacitor thus formed may have gold or platinum wires suitably soldered by the use of gold or gold alloy or other high temperature solder, to the plates of the condenser.

Where desired the condenser assembly may be transferred to the original apparatus and completely coated on all sides with a thin film of silicon nitride so as to encapsulate the condenser assembly to prevent oxidation of the capacitor plates. More complete details of the present invention in all its aspects will become more apparent by reference to the detailed description hereinafter given taken in conjunction with the drawing in which:

FIG. 1 is an apparatus diagram used in the description of the application of silicon nitride to a molybdenum substrate disc in the production of a capacitor or the like by the process that embodies the present invention; and FIG. 2 is an enlarged sectional view across a diameter of a substrate plated with silicon nitride by the process that is disclosed herein.

The apparatus that is shown in FIG. 1 of the accompanying drawing comprises a bottle 1 of hydrogen gas and a bottle 2 of nitrogen gas that are released from the bottles by valves 3 and 4 at rates that are determined by flowmeters 5 and 6, respectively throughout. Illustrative flowmeters are glass tubes with upwardly expanding tapered bores containing observable floats. The flowmeter floats 7 and 8 are displaced upwardly against gravity by the gas flow within the bore of increasing diameter along rate flow indicating scales, thereby indicating the rate of gas flow from the tanks 1 and 2, respectively throughout.

The hydrogen gas from the tank 1 is deoxidized in a deoxidizer 9 that catalytically removes any oxygen present. The hydrogen gas illustratively is passed at room temperature over the catalyst palladium on a dehydrated oxide taken from the group of oxides of aluminum and zirconium.

Commercial grades of hydrogen and nitrogen may be used with adequate purification facilities. The quartz tube 11 containing copper turnings 10 and heated by a nichrome winding 14 preferably is maintained by a temperature control 13 at from 700 to 800° C. to form copper oxide of any oxygen in the gas passed through the tube. The copper turnings 10 are reactivated after each plating run by flushing hydrogen gas backwards through the quartz tube 11 and over the copper turnings 10, thereby removing the oxygen from the copper oxide as water vapor which is exhausted to the atmosphere by opening the valve 15, closing the valve 12 and using hydrogen from the tank 1. The nitrogen valve 4 is opened sufficiently during the reduction of the copper oxide to provide a sufficient flow of nitrogen to prevent the entrance of water vapor into the $N_2$ gas line.

Commercially available hydrogen and nitrogen vary considerably from cylinder to cylinder as to both water vapor and oxygen content. In a few instances commercial nitrogen and hydrogen may be used as obtained from the supplier without further purification for the satisfactory deposition of silicon nitride dielectric.

Commercially available nitrogen and hydrogen that have been bottled during hot, humid weather may contain excessive amounts of contaminating water vapor. The excessive water vapor is removed by suitable means such as by drying towers 77, 16, 17 and 18 that are connected in series.

The apparatus here disclosed makes available the satisfactory deposition of silicon nitride under wide conditions of carrier gas purity and variable content of the contaminants water vapor and oxygen in commercially available hydrogen and nitrogen cylinders. The drying towers 77, 16, 17 and 18 conducting the mixed and oxygen free hydrogen and nitrogen gases thoroughly dry the gas mixture.

The drying towers 77, 16, 17 and 18 contain preferred drying agents such as calcium hydride, phosphorus pentoxide, molecular sieve type absorbers such as activated silica, alumina gels or the like. The dried gas mixture of hydrogen and nitrogen flows from the last drying tower 18 under the control of the line valve 25 and of the silicon tetrabromide vapor by-pass valve 26.

A portion of the gas flow is by-passed through the silicon tetrabromide that is contained within the bottle 20 by the opening of the by-pass valves 26, 27 and 28 and by the partial closing of the line valve 25. The flow rate of the gas by-passed to the bottle 20 is measured by a flowmeter 22 wherein a float 23 in a tapered bore is supported against the pull of gravity.

The bottle 20 contains silicon tetrabromide 21 in the liquid state. The mixed $H_2$ and $N_2$ carrier gas that enters the bottle 20 passes over the surface of the silicon tetrabromide and picks up its vapor.

The silicon tetrabromide laden gas passes from the bottle 20 through the valve 28 and back into the gas line to the deposition chamber 29. The gas line between the silicon tetrabromide by-pass outlet and the deposition chamber 29 may be joined by a ground glass connection 76, a rubber tube or the like, that is preferred for the convenient interchange of deposition chamber equipment.

The opening of the line valve 25 is adjusted such that part of the gas mixture passes the valve 25. The portion of the gas that passes the valve 25 is separated into two portions by the manipulation of the valves 75, 71 and 74 of the humidifier part of the assembly.

The absolute humidity and the dew point of the gases in the gas mixture that enters the plating chamber 29 is controlled at all times during the plating process. The proper amount of water vapor to catalyze the deposition reaction within the plating chamber 29 is introduced into the mixture of gases from a humidity control bulb 72 that preferably contains a water solution of sulfuric acid. Illustratively the water solution of sulfuric acid may consist of 37 grams of sulfuric acid in 30 grams of water.

The amount of the dry mixture of nitrogen and hydrogen that is by-passed through the flowmeter 70, as indicated by the flowmeter float 78, and that passes the valve 71 into the humidifier bulb 72, passes over the surface of the water solution of sulfuric acid 73 where it picks up water vapor and passes through the valve 74 into the feed line to the deposition chamber 29.

The amount of the water vapor that is so mixed with the gaseous input into the deposition chamber 29 is accurately controlled by the adjustment of the water vapor controlling valves 71 and 75. The opening of the valves 71 and 74 and the partial closing of the valve 75 controls the amount of the mixture of dry nitrogen and hydrogen that is by-passed through the flowmeter 70 into the humidifier bulb 72 and over the water solution of sulfuric acid 73 therein. The disclosed position of the valve 71 is preferred to protect the flowmeter 70.

This valve control precisely adjusts the absolute humidity and the dew point of the active plating gases to the desired amount that is required to properly catalyze the deposition reaction at the surface of the hot substrate 33 of molybdenum within the plating chamber 29, as indicated to the operator by its appearance. The described valve adjustment is made to control the composition of the mixture of gases that is introduced into the deposition chamber 29. The humidity indicating instrument that was used experimentally was the "Alnor Dewpointer" type 7000U, Serial No. 3,795, made by the Illinois Testing Laboratory, Inc., Chicago 10, Illinois, under Patents Nos. 1,945,660 and 2,566,307. The instrument was inserted at the ground glass joint 76 of the accompanying drawing. The instrument reading supplied the dew point of −80° F. to −90° F. cited herein, with no silicon tetrabromide vapor in the gas mixture.

It is essential that accurate control of the absolute humidity and dew point of the mixed nitrogen and hydrogen gases be accomplished in order that they may react with silicon tetrabromide vapor at the surface of the hot substrate and deposit consistently a uniform grade of satisfactory silicon nitride dielectric.

The amount of water vapor present in the gas mixture expressed in terms of the dew point of the mixed hydrogen and nitrogen gases preferably and illustratively falls about within the range of from −80° F. to −90° F. although the deposition of the silicon nitride dielectric occurs both above and below this preferred range.

Experimentally successful depositions of silicon nitride dielectric on molybdenum have been made in practicing the improved process that is described herein at preferred gas flow rates. Illustrative gas flow rates at 960° C. are the flow of gaseous hydrogen through the flowmeter 5 at the rate of 400 milliliters per minute; of nitrogen through the flowmeter 6 at the rate of 1300 milliliters per minute; of the dry mixture of hydrogen and nitrogen through the flowmeter 22 and through the silicon tetrabromide evaporator bulb 20 at the rate of 100 milliliters per minute; and of the dry mixture of hydrogen and nitrogen through the flowmeter 70 and the humidifier bulb 72 at the rate of 1000 milliliters per minute. The flow rates given herein are experimental values and are determined by the shape, configuration and size of the reagent container, by the temperature and pressure of the reagents, by nozzle sizes and shapes, and the like.

Satisfactory films of silicon nitride dielectric on the molybdenum 33 may be made at flow rates that differ from the above experimentally determined rates when consideration is given to the speed of the deposition; the amounts of contaminating oxygen and water vapor in the original hydrogen and nitrogen; the efficiency of the removal of water vapor from the mixed gases by the dryers 77, 16, 17 and 18; and the rate of flow through the flowmeter 70 and the humidifier 72 which introduces and controls the proper amount of water vapor in the mixed gases that is necessary to catalyze the chemical reactions between the hydrogen, nitrogen and silicon tetrabromide to properly deposit a layer of silicon nitride dielectric on the surface of the hot substrate 33.

The silicon nitride dielectric is deposited illustratively on the substrate 33 at a surface temperature in the range of about from 1700° F. to 1900° F. which about corresponds to 925° C. to 1040° C.

Capacitors may be encapsulated within silicon nitride dielectric as described in the above identified application Serial No. 837,306 wherein gold solder is used in attaching lead wires to the molybdenum substrate 33. An improved capacitor is made by using the process that is described herein. Gold solder is not objectionably softened at 960° C. and hence the temperature of 1760° F. or 960° C. is preferred as the upper limit in the encapsulation of the capacitor contemplated hereby where gold solder is a part of the capacitor.

The deposition temperature and the gas flow rates disclosed herein may be modified to increase production without departing from this invention, such as where a solder of a melting point that is higher than gold is used. Illustratively, a good quality of silicon nitride dielectric is deposited at 1025° C. with gas flow rates indicated by the flowmeters just ahead of the particular gas evaporator concerned and the flowmeters following the hydrogen and nitrogen tanks, of 600 milliliters of hydrogen per minute; 1700 milliliters of nitrogen per minute; with a flow rate of gas through the flowmeter 22 for the silicon tetrabromide bulb 20 at 200 milliliters per minute; and with a gas flow rate through the humidity bulb 72 as indicated by the flowmeter 70 of about 1500 milliliters per minute. Preferably, the total pressure within the system at least slightly exceeds ambient. The silicon nitride dielectric film that was deposited at these latter flow rates was one-half mil thick and its deposition was accomplished in 30 to 40 minutes.

The deposition chamber 29 is closed at its upper end by a stopper 30 through which extends a gas and vapor feed pipe 31 and is closed at its lower end by a stopper 66. The pipe 31 extends axially of the deposition chamber 29 and terminates downwardly in a nozzle 32 that is spaced at illustratively 4¼ inches above a molybdenum disc 33 that serves as a substrate in the making of the capacitor in accordance with the invention.

Within the deposition chamber 29 the substrate 33 rests on top of a cylindrical core 34 of graphite or the like. A copper tubing watercooled coil 35 surrounds the graphite core 34 and heats the core by induction. Radio frequency induction heater 36 supplies electrical power to the coil 35 through the pair of leads 37. Both the coil 35 and the leads 37 are watercooled.

The deposition chamber temperature of the substrate 33 is maintained at a prescribed value by means of a thermocouple 38 that contacts the graphite core 34. The thermocouple 38 passes its output over the pair of leads 39 to a well known type of adjustable automatic temperature controller 40.

The temperature controller 40 is operatively connected to the radio frequency induction heater 36 so as to control the magnitude of the plate voltage supplied to a radio frequency oscillator, not shown, and to thus control the oscillator output to regulate the temperature.

Unused and waste gases in the deposition chamber 29, pass to an exhaust stack 41 for their discharge into the atmosphere.

The product from the use of the equipment shown in FIG. 1 is a molybdenum disc 33 with a coat of silicon nitride 43 on one face thereof, as indicated in FIG. 2.

An illustrative molybdenum substrate disc is 0.005 inch in thickness and 1 inch in diameter. At the start of the fabrication of a capacitor the molybdenum disc 33 illustratively is cleaned in succession with acetone, a hot water solution of NaOH, hot chromic acid, distilled water and finally the disc is placed in the deposition chamber and is reduced with hydrogen at about 600° C.

The first stage product is made by placing a clean substrate molybdenum disc 33 on top of the graphite core 34 and setting the temperature control 40 for maintaining the surface of the disc at a temperature within the range of from 925° C. to 1040° C. This temperature range permits the pyrolytic deposition of silicon nitride on the upper surface of the substrate. When gold is present deposition is carried out at 960° C. When gold is not present the preferred deposition temperature is 1025° C.

The process that is disclosed in our application Serial No. 837,306 and that is improved hereby is believed to be the first to employ silicon nitride as a dielectric for capacitors. A high temperature capacitor is fabricated by the deposition of thin films of silicon nitride and of molybdenum by the disclosed thermochemical decomposition of chemical compounds from the vapor phase at hot substrate surfaces.

The process is applicable to not only capacitors but also to other electronic component parts that require a dielectric capable of functioning at 500° C. and above and that are used in electronic circuits of guided missiles, satellites, space vehicles and the like.

The chemical reactions that occur in the disclosed process of the thermochemical decomposition of metal compounds from their vapor phases include the deposition of silicon nitride dielectric as a film from silicon tetrabromide vapor that is reduced by hydrogen in the presence of nitrogen gas at the surface of a molybdenum disc, the temperature of which disc is about between 925° C. and 1040° C. at the surface where the silicon nitride is deposited, the silicon nitride reaction may be regarded as being $$SiBr_4+2H_2 \rightarrow Si+4HBr$$
$$3Si+2N_2 \rightarrow Si_3N_4$$

It is to be understood that modifications in equipment reagents, temperatures, pressures and method steps that are disclosed herein may be adopted for particular circumstances and conditions for the attaining of comparable results without departing from the invention disclosed herein.

We claim:

1. The method of coating a metal substrate with silicon nitride as a dielectric within a deposition chamber by heating the metal substrate to a surface temperature of between about 1700° F. and 1900° F.; passing over the heated substrate a gaseous mixture that consists of hydrogen, nitrogen, silicon tetrabromide vapor and water vapor, the water vapor in the amount within the dew point range of from −80° F. to −90° F.

2. The method of coating a metal substrate with silicon nitride as a dielectric within a deposition chamber comprising heating the metal substrate to a surface temperature of about between 1700° F. and 1900° F.; and passing over the heated substrate a gaseous mixture that consists of hydrogen, nitrogen, silicon tetrabromide vapor and water vapor in the amounts that are sufficient to accomplish the coating of the substrate and wherein the gas flow rates supplying the gaseous mixture that is reactive within the deposition chamber about at the temperature of 1760° F. are maintained at the rates indicated by corresponding flowmeters per minute of hydrogen 400 milliliters, nitrogen 1300 milliliters, silicon tetrabromide vapor 100 milliliters, and the water vapor flowmeter rate being 1000 milliliters.

3. The process of depositing silicon nitride on the surface of a cleaned and heated substrate within a deposition chamber by the thermal decomposition of a gaseous mixture that consists of silicon tetrabromide, hydrogen, nitrogen and water vapor obtained from a water solution in sulfuric acid consisting of the proportion of 37 grams of sulfuric acid in 30 grams of water.

References Cited in the file of this patent

UNITED STATES PATENTS

| | | |
|---|---|---|
| 2,771,378 | Motter | Nov. 20, 1956 |
| 2,920,006 | Yntema et al. | Jan. 5, 1960 |

OTHER REFERENCES

Powell, et al.: "Vapor Plating" (1955), John Wiley (N.Y.), pp. 95–97 relied on.